United States Patent
Liu et al.

(10) Patent No.: US 10,236,405 B2
(45) Date of Patent: Mar. 19, 2019

(54) PHOTOSENSITIVE ELEMENT, DISPLAY PANEL, DISPLAY DEVICE AND X-RAY IMAGING DEVICE

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Yingming Liu, Beijing (CN); Xue Dong, Beijing (CN); Hailin Xue, Beijing (CN); Haisheng Wang, Beijing (CN); Xiaochuan Chen, Beijing (CN); Xiaoliang Ding, Beijing (CN); Shengji Yang, Beijing (CN); Rui Xu, Beijing (CN); Changfeng Li, Beijing (CN); Wei Liu, Beijing (CN); Pengpeng Wang, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 15/554,048

(22) PCT Filed: Jan. 23, 2017

(86) PCT No.: PCT/CN2017/072174
§ 371 (c)(1),
(2) Date: Aug. 28, 2017

(87) PCT Pub. No.: WO2017/202052
PCT Pub. Date: Nov. 30, 2017

(65) Prior Publication Data
US 2018/0175232 A1   Jun. 21, 2018

(30) Foreign Application Priority Data

May 23, 2016   (CN) .......................... 2016 1 0344361

(51) Int. Cl.
*H01L 27/15* (2006.01)
*H01L 31/02* (2006.01)
(Continued)

(52) U.S. Cl.
CPC .... *H01L 31/1136* (2013.01); *H01L 27/14659* (2013.01); *H01L 27/15* (2013.01);
(Continued)

(58) Field of Classification Search
CPC ......... H01L 27/14612; H01L 27/14659; H01L 27/15; H01L 29/78675; H01L 31/02019;
(Continued)

(56) References Cited

U.S. PATENT DOCUMENTS

2008/0017866 A1\* 1/2008 Sato ...................... H01L 29/786
257/72
2009/0020686 A1\* 1/2009 Sano ..................... G06F 3/0412
250/208.1
(Continued)

FOREIGN PATENT DOCUMENTS

AU   2002253375 A8   11/2002
CN   101285975 A    10/2008
(Continued)

OTHER PUBLICATIONS

Search Report for International Application No. PCT/CN2017/072174 dated Mar. 30, 2017.
(Continued)

*Primary Examiner* — Joseph M Galvin, III
(74) *Attorney, Agent, or Firm* — Calfee, Halter & Griswold LLP

(57) ABSTRACT

The embodiments of the invention provide a photosensitive element, a display panel, a display device, and an X-ray imaging device. The photosensitive element includes a first top gate type thin film transistor as a control switch and a second top gate type thin film transistor serving as a photosensitive unit. The first top gate type thin film transistor is connected to the second top gate type thin film transistor. A gate of the second thin film transistor includes a transparent region corresponding to at least a part of an active layer of the second thin film transistor, thereby achieving a measurement of a light intensity entering the second thin film transistor when the first thin film transistor and the second thin film transistor are turned on simultaneously.

20 Claims, 6 Drawing Sheets

(51) Int. Cl.
*H01L 31/113* (2006.01)
*H01L 27/146* (2006.01)
*H01L 29/786* (2006.01)
*H01L 31/0368* (2006.01)
*H01L 31/119* (2006.01)
*H01L 31/115* (2006.01)

(52) U.S. Cl.
CPC .. *H01L 29/78675* (2013.01); *H01L 31/02019* (2013.01); *H01L 31/03682* (2013.01); *H01L 31/115* (2013.01); *H01L 31/119* (2013.01); *H01L 27/14612* (2013.01)

(58) Field of Classification Search
CPC ........... H01L 31/03682; H01L 31/1136; H01L 31/119
See application file for complete search history.

(56) References Cited

U.S. PATENT DOCUMENTS

| | | | |
|---|---|---|---|
| 2009/0315877 A1 | 12/2009 | Deane | |
| 2014/0155728 A1* | 6/2014 | Lee | A61B 6/462 600/407 |
| 2015/0371075 A1* | 12/2015 | Lin | H01L 27/14678 250/208.1 |
| 2016/0232846 A1 | 8/2016 | Xu | |
| 2017/0123542 A1* | 5/2017 | Xie | H01L 21/77 |
| 2017/0220194 A1* | 8/2017 | Wu | G06F 3/042 |

FOREIGN PATENT DOCUMENTS

| | | |
|---|---|---|
| CN | 101349821 A | 1/2009 |
| CN | 101385064 A | 3/2009 |
| CN | 103956142 A | 7/2014 |
| CN | 105977268 A | 9/2016 |
| JP | 2007233109 A | 9/2007 |
| WO | 02091493 A2 | 11/2002 |

OTHER PUBLICATIONS

First Office Action for Chinese Patent Application No. 201610344361.7 dated May 3, 2018.

* cited by examiner transparent region

PHOTOSENSITIVE ELEMENT, DISPLAY PANEL, DISPLAY DEVICE AND X-RAY IMAGING DEVICE

RELATED APPLICATIONS

The present application is the U.S. national phase entry of the international application PCT/CN2017/072174, with an international filing date of Jan. 23, 2017, which claims the benefit of Chinese Patent Application No. 201610344361.7, filed on May 23, 2016, the entire disclosures of which are incorporated herein by reference.

TECHNICAL FIELD

The present invention relates to the field of semiconductor technology, and more particularly to a photosensitive element, a display panel, a display device, and an X-ray imaging device.

BACKGROUND

Existing photosensitive elements are generally made of diodes. The photosensitive effect is not ideal. Moreover, the sensitivity of the current photosensitive element made of amorphous silicon thin film transistor is not high. Therefore, it is desired to provide a photosensitive element used in the field of low-temperature polysilicon thin film transistor.

SUMMARY

The embodiments of the present invention provide a photosensitive element and a photosensitive device for realizing a measurement of light intensity in a low-temperature polysilicon thin film transistor.

To this end, the embodiments of the present invention apply the following technical solutions.

An embodiment of the invention provides a photosensitive element. The photosensitive element includes a first thin film transistor as a control switch and a second thin film transistor connected to the first thin film transistor and serving as a photosensitive unit. The first thin film transistor and the second thin film transistor are both top gate type thin film transistors. A gate of the second thin film transistor includes a transparent region corresponding to at least a part of an active layer of the second thin film transistor, thereby achieving a measurement of a light intensity entering the second thin film transistor when the first thin film transistor and the second thin film transistor are turned on simultaneously.

In certain exemplary embodiments, both the first thin film transistor and the second thin film transistor are low-temperature polysilicon thin film transistors.

In certain exemplary embodiments, a source of the first thin film transistor is an output signal terminal of the photosensitive element, a drain of the first thin film transistor is connected to a source of the second thin film transistor, and a drain of the second thin film transistor is an input signal terminal of the photosensitive element.

In certain exemplary embodiments, a source of the second thin film transistor is an output signal terminal of the photosensitive element, a drain of the second thin film transistor is connected to a source of the first thin film transistor, and a drain of the first thin film transistor is an input signal terminal of the photosensitive element.

In certain exemplary embodiments, a gate of the first thin film transistor and the gate of the second thin film transistor are respectively connected to different control signal lines.

In certain exemplary embodiments, a gate of the first thin film transistor and the gate of the second thin film transistor are respectively connected to the same control signal lines.

In certain exemplary embodiments, both the first thin film transistor and the second thin film transistor are single gate structure thin film transistors or double gate structure thin film transistors.

In certain exemplary embodiments, the first thin film transistor is a single gate structure thin film transistor, and the second thin film transistor is a double gate structure thin film transistor; alternatively, the first thin film transistor is a double gate structure thin film transistor, and the second thin film transistor is a single gate structure thin film transistor.

In certain exemplary embodiments, the gate of the second thin film transistor is all transparent.

An embodiment of the invention further provides a display panel including at least one photosensitive element according to any one of the above mentioned embodiments.

In certain exemplary embodiments, the display panel includes a plurality of pixel units arranged in an array and a plurality of photosensitive elements according to any one of the above mentioned embodiments. The plurality of photosensitive elements is one-to-one corresponding to the plurality of pixel units.

In certain exemplary embodiments, the plurality of photosensitive elements is tiled in a layer different from the pixel units.

In certain exemplary embodiments, each of the plurality of photosensitive elements is integrated in one pixel unit.

In certain exemplary embodiments, the first thin film transistor of the photosensitive element is configured to drive a corresponding pixel unit.

An embodiment of the invention further provides a display device including the display panel according to any one of the above mentioned embodiments.

An embodiment of the invention also provides a photosensitive device including at least one photosensitive element according to any one of the above mentioned embodiments.

An embodiment of the invention further provides an X-ray imaging device including at least one photosensitive element according to any one of the above mentioned embodiments.

In the embodiments of the present invention, a thin film transistor is used as the photosensitive unit and another thin film transistor serves as a switching element for controlling the photosensitive unit. Further, the thin film transistor as the photosensitive unit is different from the conventional thin film transistor. The conductive film layer serving as the gate is designed to be at least partially transparent. In this way, the active layer covered by the gate can be exposed to the ambient light, thereby realizing the sensing of the light intensity. In addition, for the application on the display panel or the display device, the gate of the top gate type thin film transistor is typically arranged on the light exit side of the display panel or the display device, so that a film layer such as light shielding layer and planarization layer can be used to shield the light beam from the inside of the display panel or the display device (i.e., the light beam incident on the side of the active layer opposite to the gate), avoiding the interference of the light beam. Moreover, the addition of the thin film transistor as the control switch can effectively distinguish the reading of the current signal at the output signal terminal under different light irradiation and enhance the sensitivity of the photosensitive element. The photosensitive element achieves the sensing of light intensity in the top gate type thin film transistor, effectively extending the application scope of the photosensitive element. The measurement efficiency and speed of the photosensitive element are relatively high.

BRIEF DESCRIPTION OF THE DRAWINGS

In order to more clearly illustrate the technical solutions in embodiments of the invention or in the prior art, the appended drawings needed to be used in the description of the embodiments or the prior art will be introduced briefly in the following. Obviously, the drawings in the following description are only some embodiments of the invention, and for those of ordinary skills in the art, other drawings may be obtained according to these drawings under the premise of not paying out creative work.

DETAILED DESCRIPTION OF THE INVENTION

In order to more clearly illustrate the purpose, technical solutions and advantages of the present invention, in the following, the technical solutions in the embodiments of the invention will be described clearly and completely in connection with the drawings in the embodiments of the invention. Obviously, the described embodiments are only part of the embodiments of the invention, and not all of the embodiments. Based on the embodiments in the invention, all other embodiments obtained by those of ordinary skills in the art under the premise of not paying out creative work pertain to the protection scope of the invention.

Figure 1:
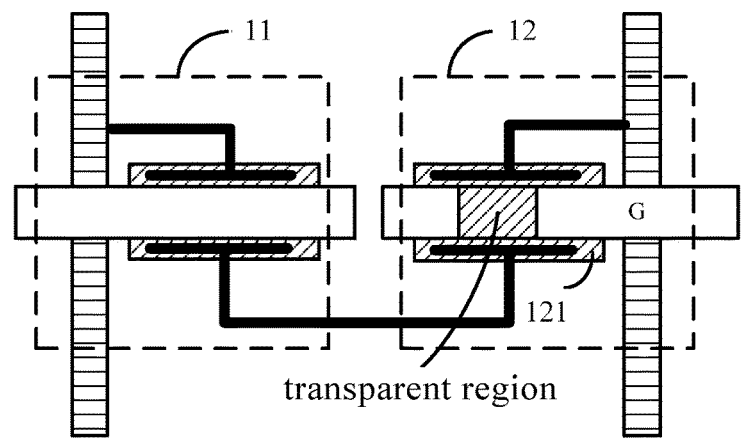
FIG. 1(a) is a structural schematic diagram of a photosensitive element according to an embodiment of the invention.
FIG. 1(b) is a schematic diagram of the principle of the photosensitive element according to the embodiment of the invention
Figure 1:
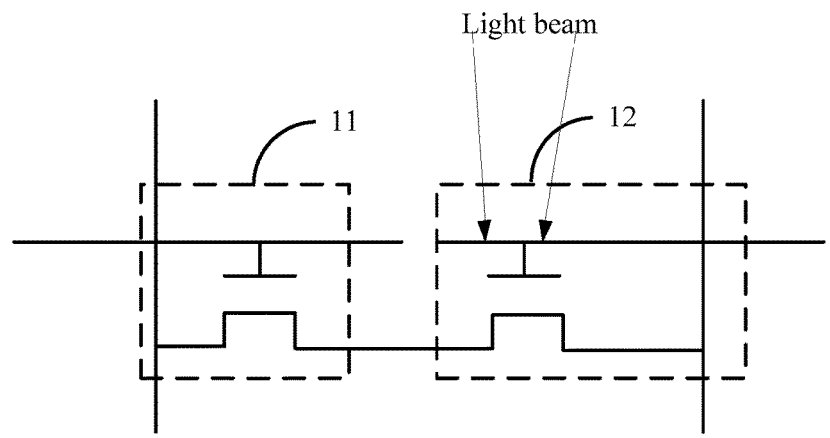

FIG. 1(a) is a structural schematic diagram of a photosensitive element according to an embodiment of the invention. The photosensitive element mainly includes a first thin film transistor 11 as a control switch and a second thin film transistor 12 connected to the first thin film transistor 11 and serving as a photosensitive unit. The first thin film transistor 11 and the second thin film transistor 12 are both top gate type thin film transistors. A gate G of the second thin film transistor 12 includes a transparent region corresponding to at least a part of an active layer 121 of the second thin film transistor 12, thereby achieving a measurement of a light intensity entering the second thin film transistor 12 when the first thin film transistor 11 and the second thin film transistor 12 are turned on simultaneously.

In this technical solution, a thin film transistor is used as the photosensitive unit and another thin film transistor serves as a switching element for controlling the photosensitive unit. Further, the thin film transistor as the photosensitive unit is different from the conventional thin film transistor. The conductive film layer serving as the gate is designed to be at least partially transparent. In this way, the active layer covered by the gate can be exposed to the ambient light, thereby realizing the sensing of the light intensity. In addition, for the application on the display panel or the display device, the gate of the top gate type thin film transistor is typically arranged on the light exit side of the display panel or the display device, so that a film layer such as light shielding layer and planarization layer can be used to shield the light beam from the inside of the display panel or the display device (i.e., the light beam incident on the side of the active layer opposite to the gate), avoiding the interference of the light beam. Moreover, the addition of the thin film transistor as the control switch can effectively distinguish the reading of the current signal at the output signal terminal under different light irradiation and enhance the sensitivity of the photosensitive element. The photosensitive element achieves the sensing of light intensity in the top gate type thin film transistor, effectively extending the application scope of the photosensitive element. The measurement efficiency and speed of the photosensitive element are relatively high.

In certain exemplary embodiments, both the first thin film transistor and the second thin film transistor are low-temperature polysilicon thin film transistors. Since low-temperature polysilicon is applied, its inherent high response speed can improve the sensitivity of the photosensitive element.

The principle of the sensing measurement of the photosensitive element in the present invention can be simply described with FIG. 1(b). If both of the thin film transistors are turned on, a signal is input from the input signal terminal of the second thin film transistor. The signal flows through the second thin film transistor and the first thin film transistor, and another signal is output from the output signal terminal of the first thin film transistor. In the prior art, the active layer of the top gate type thin film transistor is shielded by the gate to ensure the effectiveness of the active layer. In the case of fingerprint press, when the photosensitive unit 12 (the second thin film transistor) in the photosensitive device is pressed by the fingerprint, the light intensity received by the active layer of the photosensitive unit 12 is changed. Further, the resistance of the photosensitive unit 12 is changed, resulting in a significant change in the output current of the drain on the control switch 11 (first thin film transistor) side, i.e., a significant difference from the output current when the fingerprint is not pressed, thereby realizing the measurement of the fingerprint press at this position. The fingerprint press can be replaced by a stylus press or light irradiation such as X-ray irradiation. The present invention does not specifically limit the manner of how to act on the photosensitive element, as long as the light intensity on the active layer of the photosensitive unit is changed.

It should be noted that in the embodiment of the present invention, the signal line connected to the input signal terminal of the photosensitive element and the signal line connected to the output signal terminal of the photosensitive element (the signal line filled with the stripes in the drawings of the present invention) may be data lines or other signal lines.

Figure 3:
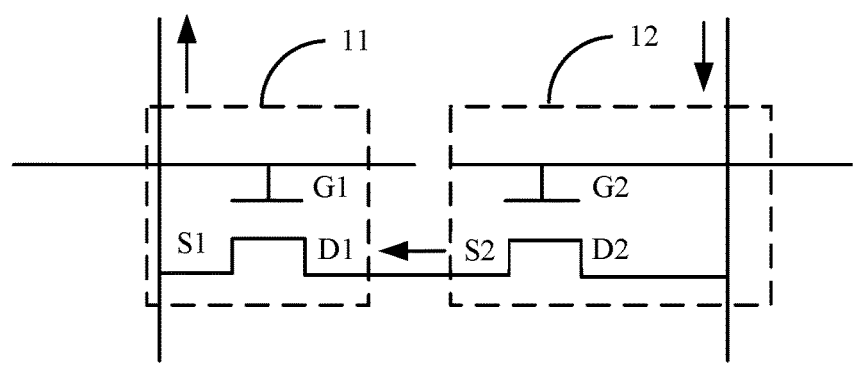
FIG. 3 is a schematic diagram of an internal connection mode of a photosensitive element provided by an embodiment of the present invention.

In the embodiment of the present invention, the input signal terminal of the photosensitive element is located on the side of the second thin film transistor, and the output signal terminal is located on the side of the first thin film transistor. In particular, referring to FIG. 3, the source S1 of the first thin film transistor 11 is the output signal terminal of the photosensitive element, as shown by the arrow direction. The drain D1 of the first thin film transistor 11 is connected to the source S2 of the second thin film transistor 12 to establish a connected state between the first thin film transistor 11 and the second thin film transistor 12. The drain D1 of the second thin film transistor 12 is an input signal terminal of the photosensitive element, as indicated by the arrow direction. It will be appreciated by those skilled in the art that the source and drain are interchangeable for a thin film transistor.

In certain exemplary embodiments, in the photosensitive element, the control signal applied on the gate of the first thin film transistor and the control signal applied on the gate of the second thin film transistor can be the same or different. In particular, this can be illustrated with the following two embodiments.

In an embodiment, the gate of the first thin film transistor and the gate of the second thin film transistor are respectively connected to different control signal lines, i.e., different control signals are respectively applied on the gate of the first thin film transistor and the gate of the second thin film transistor. In particular, referring to FIG. 2(a), the gate G1 of the first thin film transistor 11 and the gate G2 of the second thin film transistor 12 are independent from each other and are connected to different control signal lines to which different control signals are applied: the gate G1 of the first thin film transistor 11 is connected to the first control signal line L1 to which the first control signal is applied, and the gate G2 of the second thin film transistor 12 is connected to the second control signal line L2 to which the second control signal is applied.

In addition, it should be noted that in a specific application scenario that can be implemented, if a plurality of photosensitive elements are included, the gates of the first thin film transistors in the photosensitive elements can be connected to the same control signal line, for example, to the first control signal line L1. The gates of the second thin film transistor in the photosensitive elements can be connected to another control signal line, for example, to the second control signal line L2. In order to avoid blocking or crossing between the gate lines and the control signal lines, the connection can be achieved by means of via holes.

With such a solution, the gate of the first thin film transistor and the gate of the second thin film transistor are connected to different control signal lines respectively, it is possible to respectively control the two thin film transistors in a relatively flexible manner. However, the photosensitive element can work only if the two thin film transistors are turned on simultaneously, to achieve the measurement of different light intensity.

In another embodiment, the gate of the first thin film transistor and the gate of the second thin film transistor are respectively connected to the same control signal lines, i.e., the same control signal is applied to the gate of the first thin film transistor and the gate of the second thin film transistor. In particular, referring to FIG. 2(b), the gate G1 of the first thin film transistor 11 is connected to the gate G2 of the second thin film transistor 12, and connected to the same control signal line L3 on an end.

Figure 2:
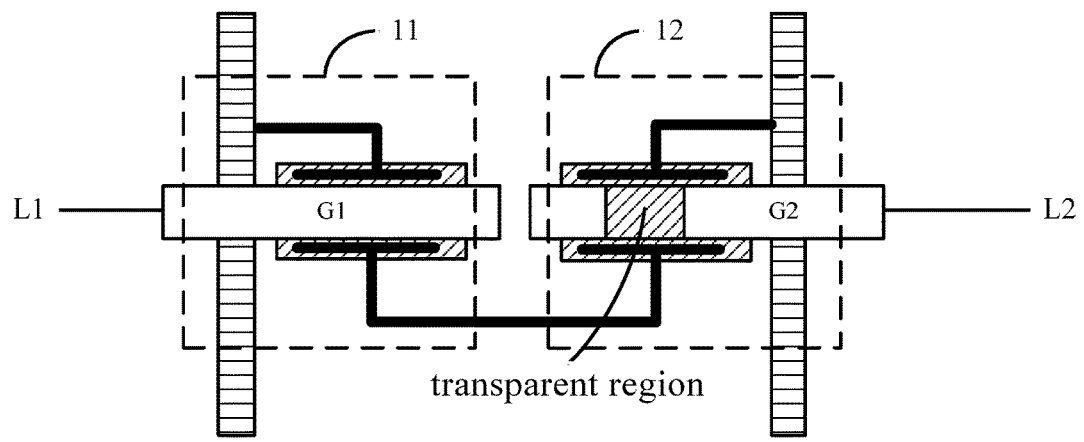
FIG. 2(a)-FIG. 2(c) show three control signal application modes corresponding to the gates of the photosensitive elements provided in the embodiments of the present invention.
Figure 2:
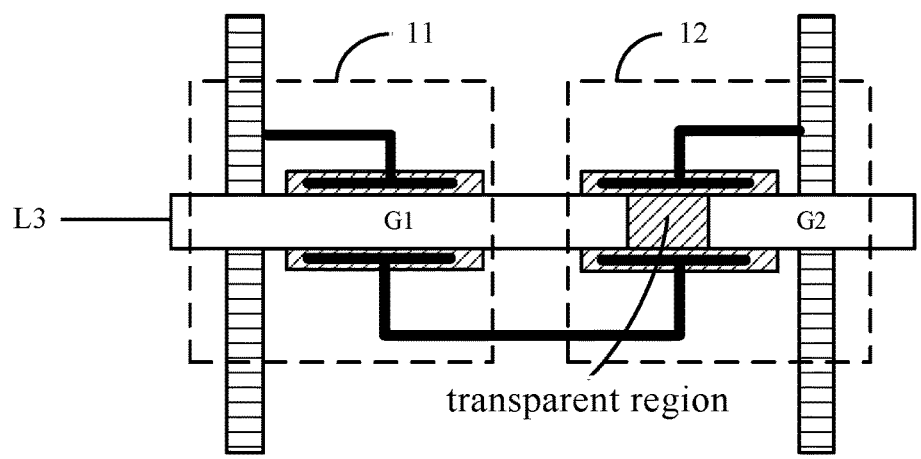
Figure 2:
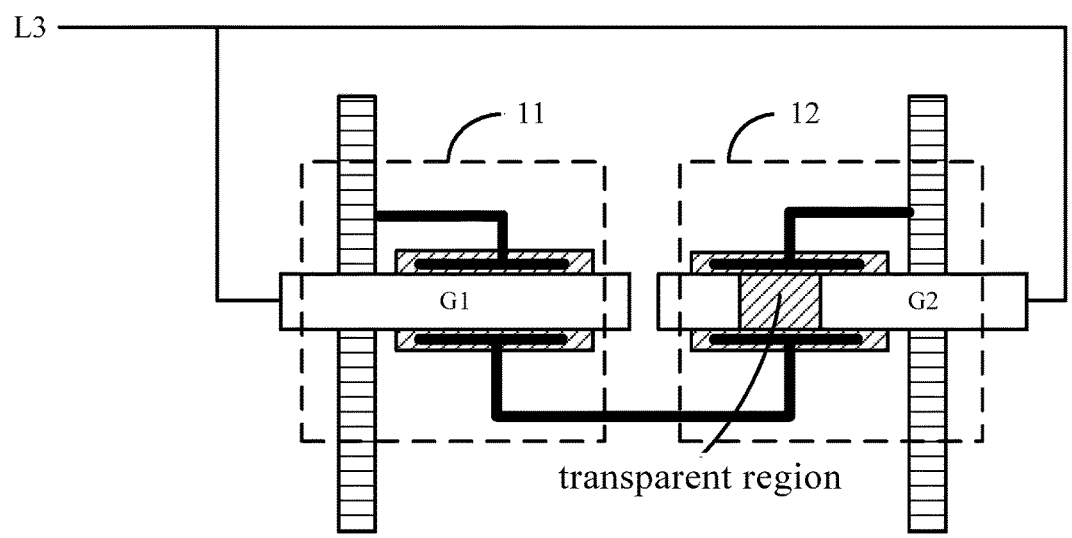

Alternatively, as shown in FIG. 2(c), the gate G1 of the first thin film transistor 11 and the gate G2 of the second thin film transistor 12 are independent from each other and connected to the same control signal line L3.

With such a solution, the gate of the first thin film transistor and the gate of the second thin film transistor are connected to the same control signal line, for the structure shown in FIG. 2(b), they can only be connected the same control signal line. For the structure shown in FIG. 2(c), they can be connected to different signal lines or be connected to the same signal line. Considering the close distance between the two thin film transistors, in order to avoid mutual interference between the signal lines caused by connecting different signal lines, two independent gates can be connected to the same control signal line, avoiding the interference and simplifying the wiring structure.

It should be noted that the present invention does not limit the specific wiring mode in the photosensitive element. For the top gate structure, since the source, the drain and the active layer can be connected through via holes or other achievable way, the wiring of the photosensitive element can be performed in a more flexible manner without affecting the performance of the thin film transistor.

Figure 4:
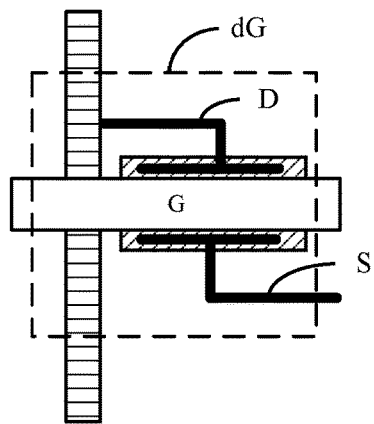
FIG. 4(a)-FIG. 4(f) are respectively structural schematic diagrams of photosensitive elements including a single gate structure thin-film transistor and/or a double gate structure thin-film transistor.
Figure 4:
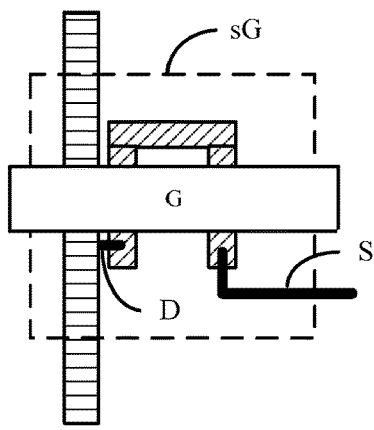
Figure 4:
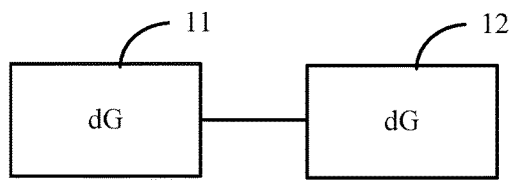
Figure 4:
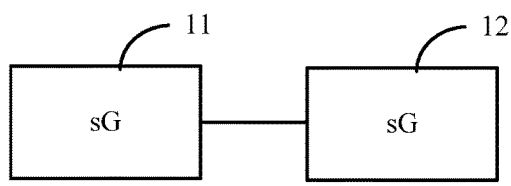
Figure 4:
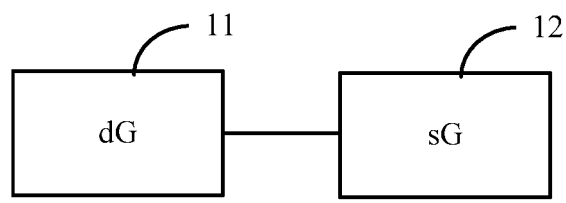
Figure 4:
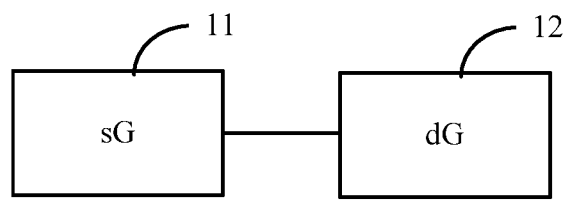

In certain exemplary embodiments of the present invention, the thin film transistor in the photosensitive element can be a single gate structure thin film transistor dG. As shown in FIG. 4(a), in the single gate structure thin film transistor dG, the oblique stripe region is the active layer, and the gate G is located on the active layer. The source S and the drain D are electrically connected to the active layer through via holes or the like, respectively. In some embodiments, the thin film transistor in the photosensitive element can also be a double gate structure thin film transistor sG. As shown in FIG. 4(b), in the double gate structure thin film transistor sG, the oblique stripe region is the active layer, and the gate G is located on the active layer. Since the active layer has a U-shaped structure, two gates are formed by the gate lines crossing the active layer and the active layer, so as to form a double gate structure, and the source S and the drain D can be electrically connected to the active layer through via holes or the like, respectively.

In an embodiment of the present invention, both the first thin film transistor and the second thin film transistor are single gate structure thin film transistors. As shown in FIG. 4(c), both the first thin film transistor 11 and the second thin film transistor 12 are single gate structure thin film transistors dG. In this structure, the gate of the second thin film transistor 12 is a transparent conductive film layer so as to expose the active layer in the second thin film transistor 12. Therefore, the second thin film transistor 12 functions as a photosensitive member, different intensities of light from external can be sensed and ultimately converted into output current. If the output current of the output signal terminal is changed when the first thin film transistor 11 on the control switch side is turned on, it means that X-ray, an object or the like is acting on the photosensitive unit to realize the ultimate measurement, otherwise, there is no X-ray, object or the like acting on the photosensitive unit.

As shown in FIG. 4(d), both the first thin film transistor 11 and the second thin film transistor 12 are double gate structure thin film transistors sG. In this structure, the gates (two conductive film layers) of the second thin film transistor 12 are transparent so as to expose the active layer in the second thin film transistor 12. Therefore, the second thin film transistor 12 can function as a photosensitive member, and different intensities of light from external can thus be sensed. The area of the exposed active layer may be relatively large due to the fact that there are two gates in the double gate structure. Thus, the degree of change in the output current is relatively high. That is, the exposed more portion of the active layer can be affected by light irradiation, and the magnitude of the output current can be changed to a large extent.

For example, for the single gate structure photosensitive element shown in FIG. 4(c), the output current is I1 when it is not subjected to the action, the output current becomes I2 when it is subjected to the action, and thus the current difference before and after the change is ΔI. For the double gate structure photosensitive element shown in FIG. 4(d), the output current is I3 when it is not subjected to the action, the output current becomes I4 when it is subjected to the action, and thus the current difference before and after the change is ΔI'. It is known that ΔI'>ΔI, the current change of the photosensitive element shown in FIG. 4(d) is larger. Therefore, as a photosensitive element, the sensitivity of the double gate structure shown in FIG. 4(d) is higher than that of the single gate structure shown in FIG. 4(c).

For another example, the photosensitive element provided by the embodiment of the invention can also be a combination of a single gate structure thin film transistor dG and a double gate structure thin film transistor sG. As shown in FIG. 4(e), the first thin film transistor 11 is a single gate structure thin film transistor dG, and the second thin film transistor 12 is a double gate structure thin film transistor sG. Alternatively, as shown in FIG. 4(f), the first thin film transistor 11 is a double gate structure thin film transistor sG, and the second thin film transistor 12 is a single gate structure thin film transistor dG. It should be noted that both of the photosensitive elements shown in FIG. 4(e) and FIG. 4(f) can realize the measurement for different light beams, particularly for the light beam with respect to the unacted photosensitive element, thereby realizing the measurement of light such as X-ray and fingerprint touch from the outside.

Figure 5:
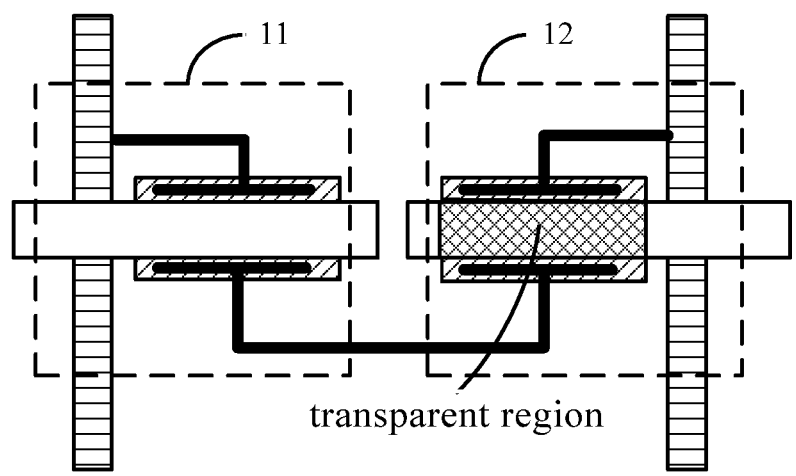
FIG. 5(a)-FIG. 5(b) are respectively schematic diagrams showing a completely transparent gate exposing an active layer according to the embodiments of the invention.
Figure 5:
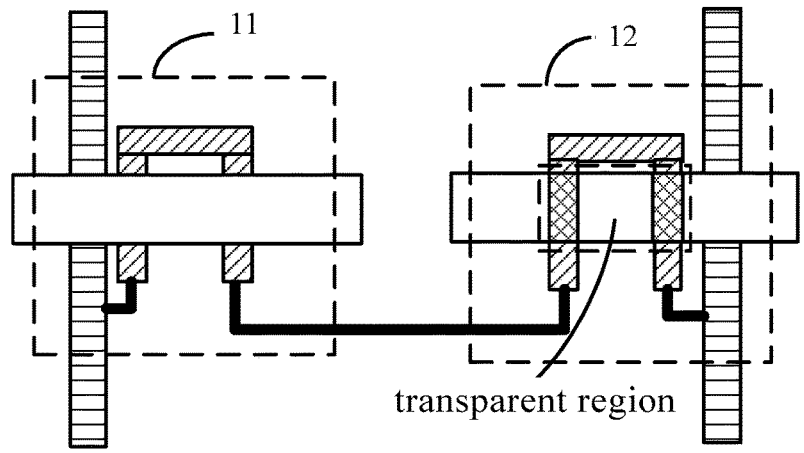

In certain exemplary embodiments, in an embodiment of the invention, in order to improve the sensitivity of the photosensitive element, the entire gate of the second thin film transistor can be transparent so as to expose the active layer of the second thin film transistor as much as possible. As shown in FIG. 5(a), for a single gate structure thin film transistor, the area of the active layer irradiated by light (i.e., the grid region) is large enough. In this manner, the variation of the current on the output signal terminal can be more accurately detected, improving the sensitivity of the photosensitive element. Similarly, as shown in FIG. 5(b), in the double gate structure thin film transistor, the area of the active layer irradiated by light (i.e., the grid region) is large enough due to the gate crossing the two active layers.

Figure 6:
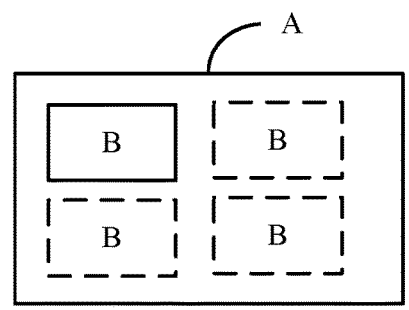
FIG. 6 is a structural schematic diagram of a photosensitive device provided by an embodiment of the present invention.

Similarly, an embodiment of the present invention also provides a photosensitive device. FIG. 6 is a schematic diagram showing the structure of the photosensitive device. The photosensitive device A mainly includes at least one photosensitive element B according to any one of the above embodiments.

An embodiment of the invention further provides a display panel. In certain exemplary embodiments, the display panel includes the above mentioned photosensitive element.

Figure 7:
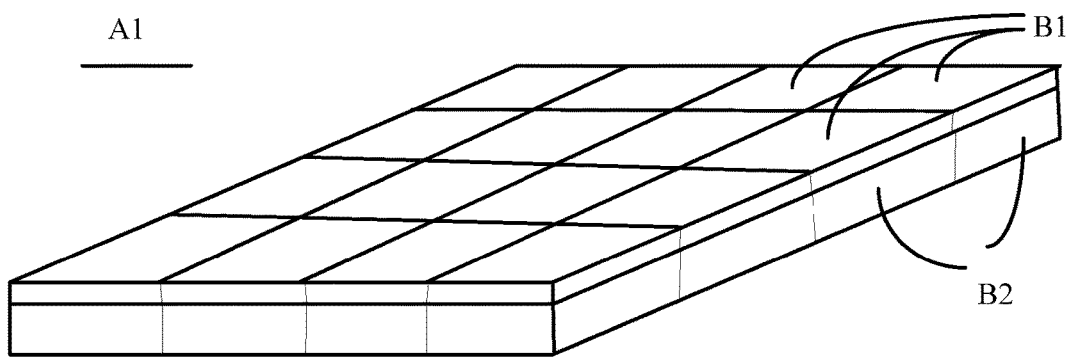
FIG. 7(a) and FIG. 7(b) are structural schematic diagrams of display panels provided by embodiments of the present invention.
Figure 7:
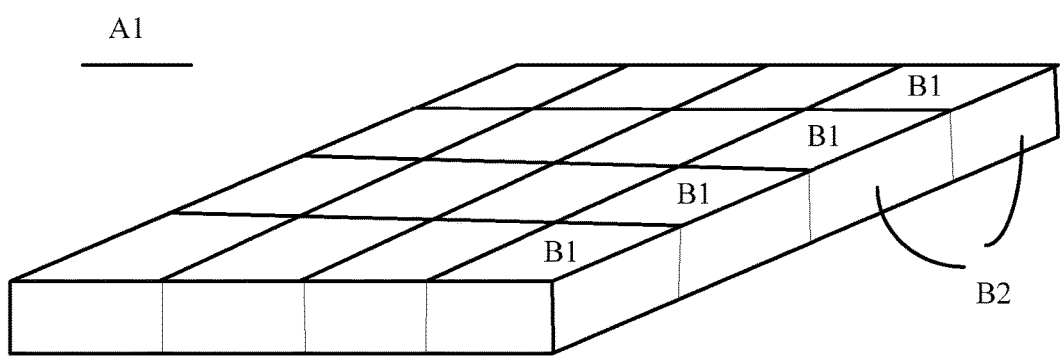

In some embodiments, the display panel includes a plurality of pixel units arranged in an array and a plurality of photosensitive elements according to any one of the above mentioned embodiments. The plurality of photosensitive elements are one-to-one corresponding to the plurality of pixel units. In certain exemplary embodiments, as shown in FIG. 7(a), the plurality of photosensitive elements B1 are tiled in a layer different from the pixel units B2. Alternatively, as shown in FIG. 7(b), each of the plurality of photosensitive elements B1 is integrated in one pixel unit B2. In the drawing, only a part of the pixel units B2 are indicated to be integrated with the photosensitive elements B1, other pixel units B2 can also be integrated with the photosensitive elements B1, which are not indicated.

For example, when an object (for example, a finger or a stylus) touches the display panel A1 or light such as X-ray irradiates the surface of the display panel A1, the light intensity incident on the active layer of the photosensitive element B1 will change, changing the resistance of the channel, thereby changing the output current on the output signal terminal. When different output currents on the output signal terminal are detected, it can be determined that the area of the display panel is subjected to touch or irradiated by light, thereby achieving the measurement of fingerprints or light stimulation.

In the display panel shown in FIG. 7(a), the sensing layer composed of the photosensitive elements B1 can be tiled on any one of the realizable layers in the display panels A1 without affecting the display effect. In order to ensure that the signal lines do not interfere with each other and the wiring complexity is simplified, the control signal for the photosensitive element B1 can be provided by an additional signal line.

In the display panel shown in FIG. 7(b), each photosensitive element is integrated in each pixel unit of the display panel. Similarly, In order to avoid mutual interference between the signal lines and to avoid complexity caused by additional wiring, the control signal for the photosensitive element can be provided by the gate line defining the pixel unit.

Further, in order to simplify the element composition of each pixel unit, the first thin film transistor as a control switch in the photosensitive element can also be used to drive the corresponding pixel unit. Thus, the photosensitive element shares a control switch with the pixel unit, avoiding the presence of two control switches in each pixel unit, simplifying the structure of each pixel unit as far as possible.

In certain exemplary embodiments, an embodiment of the present invention also provides an X-ray imaging device. The photosensitive element described in the above embodiments can also be integrated in the X-ray imaging device or other medical apparatus, of which the specific structure is not described herein. The photosensitive element can be designed and applied based on the principle of the photosensitive element and the specific application scenarios.

Apparently, the person skilled in the art may make various alterations and variations to the invention without departing the spirit and scope of the invention. As such, provided that these modifications and variations of the invention pertain to the scope of the claims of the invention and their equivalents, the invention is intended to embrace these alterations and variations.

What is claimed is:

1. A photosensitive element comprising: a first thin film transistor as a control switch and a second thin film transistor serving as a photosensitive unit, wherein the first thin film transistor is connected to the second thin film transistor;

wherein the first thin film transistor and the second thin film transistor are both top gate type thin film transistors; a gate of the second thin film transistor comprises a transparent region corresponding to at least a part of an active layer of the second thin film transistor;

and wherein a source of the first thin film transistor is an output signal terminal of the photosensitive element, a drain of the first thin film transistor is connected to a source of the second thin film transistor, and a drain of the second thin film transistor is an input signal terminal of the photosensitive element.

2. The photosensitive element according to claim 1, wherein both the first thin film transistor and the second thin film transistor are low-temperature polysilicon thin film transistors.

3. The photosensitive element according to claim 1, wherein a gate of the first thin film transistor and the gate of the second thin film transistor are respectively connected to different control signal lines.

4. The photosensitive element according to claim 1, wherein a gate of the first thin film transistor and the gate of the second thin film transistor are respectively connected to the same control signal lines.

5. The photosensitive element according to claim 1, wherein both the first thin film transistor and the second thin film transistor are single gate structure thin film transistors or double gate structure thin film transistors.

6. The photosensitive element according to claim 1, wherein the first thin film transistor is a single gate structure thin film transistor, and the second thin film transistor is a double gate structure thin film transistor; alternatively, the first thin film transistor is a double gate structure thin film transistor, and the second thin film transistor is a single gate structure thin film transistor.

7. The photosensitive element according to claim 1, wherein the gate of the second thin film transistor is all transparent.

8. A display panel, comprising at least one photosensitive element according to claim 1.

9. A display device comprising the display panel according to claim 8.

10. An X-ray imaging device comprising at least one photosensitive element according to claim 1.

11. A photosensitive element comprising: a first thin film transistor as a control switch and a second thin film transistor serving as a photosensitive unit, wherein the first thin film transistor is connected to the second thin film transistor;

wherein the first thin film transistor and the second thin film transistor are both top gate type thin film transistors; a gate of the second thin film transistor comprises a transparent region corresponding to at least a part of an active layer of the second thin film transistor;

and wherein a source of the second thin film transistor is an output signal terminal of the photosensitive element, a drain of the second thin film transistor is connected to a source of the first thin film transistor, and a drain of the first thin film transistor is an input signal terminal of the photosensitive element.

12. The photosensitive element according to claim 11, wherein both the first thin film transistor and the second thin film transistor are low-temperature polysilicon thin film transistors.

13. The photosensitive element according to claim 11, wherein a gate of the first thin film transistor and the gate of the second thin film transistor are respectively connected to different control signal lines.

14. The photosensitive element according to claim 11, wherein a gate of the first thin film transistor and the gate of the second thin film transistor are respectively connected to the same control signal lines.

15. The photosensitive element according to claim 11, wherein both the first thin film transistor and the second thin film transistor are single gate structure thin film transistors or double gate structure thin film transistors.

16. The photosensitive element according to claim 11, wherein the first thin film transistor is a single gate structure thin film transistor, and the second thin film transistor is a double gate structure thin film transistor; alternatively, the first thin film transistor is a double gate structure thin film transistor, and the second thin film transistor is a single gate structure thin film transistor.

17. The photosensitive element according to claim 11, wherein the gate of the second thin film transistor is all transparent.

18. A display panel, comprising at least one photosensitive element according to claim 11.

19. A display device comprising the display panel according to claim 18.

20. An X-ray imaging device comprising at least one photosensitive element according to claim 11.

* * * * *